United States Patent
Miller et al.

(10) Patent No.: US 11,230,132 B2
(45) Date of Patent: Jan. 25, 2022

(54) COMPOSITION COMPRISING DIRECTLY WRITTEN METAL FEATURES AND METHOD OF FORMATION

(71) Applicant: Case Western Reserve University, Cleveland, OH (US)

(72) Inventors: Christopher J. Miller, Cleveland, OH (US); Souvik Ghosh, Cleveland, OH (US); Yongkun Sui, Cleveland, OH (US); R. Mohan Sankaran, University Heights, OH (US); Christian A. Zorman, Euclid, OH (US)

(73) Assignees: Case Western Reserve University, Cleveland, OH (US); THE UNITED STATES GOVERNMENT AS REPRESENTED BY THE UNITED STATES DEPARTMENT OF VETERANS AFFAIRS, Washington, DC (US)

( * ) Notice: Subject to any disclaimer, the term of this patent is extended or adjusted under 35 U.S.C. 154(b) by 853 days.

(21) Appl. No.: 15/953,134

(22) Filed: Apr. 13, 2018

(65) Prior Publication Data
US 2018/0297387 A1     Oct. 18, 2018

Related U.S. Application Data

(60) Provisional application No. 62/655,456, filed on Apr. 10, 2018, provisional application No. 62/485,230, filed on Apr. 13, 2017.

(51) Int. Cl.
*B41M 7/00* (2006.01)
*C09D 11/52* (2014.01)
(Continued)

(52) U.S. Cl.
CPC ......... *B41M 7/0072* (2013.01); *B29C 64/118* (2017.08); *B41M 5/0047* (2013.01);
(Continued)

(58) Field of Classification Search
CPC   B41M 7/0072; B41M 5/0064; B41M 5/0047; C09D 11/38; C09D 11/52;
(Continued)

(56) References Cited

U.S. PATENT DOCUMENTS 8,529,749 B2   9/2013   Sankaran
8,715,608 B2   5/2014   Sankaran et al.
(Continued)

OTHER PUBLICATIONS

Gerard Cummins et al., "Inkjet printing of conductive materials: a review", dated 2012, https://doi.org/10/1108/03056121211280413, "Circuit World", , pp. 193-213, vol. 38, No. 4, Publisher: Emerald Group Publishing Limited.
(Continued)

*Primary Examiner* — Yaovi M Ameh
(74) *Attorney, Agent, or Firm* — Kaplan Breyer Schwarz, LLP

(57) ABSTRACT

A method for directly writing metal traces on a wide range of substrate materials is disclosed. The method includes writing a pattern of particle-free metal-salt-based ink on the substrate followed by a plasma-based treatment to remove the non-metallic components of the ink and decompose its metal salt into pure metal. The ink is based on a multi-part solvent whose components differ in at least one of evaporation rate, surface tension, and viscosity, which improves the manner in which the ink is converted into its metal constituent via the plasma treatment. In some embodiments, a microplasma is used for post-treatment of the deposited ink, where the plasma properties are controlled to provide
(Continued)

different material properties, such as porosity and effective resistivity, in different regions of the metal pattern.

9 Claims, 10 Drawing Sheets

(51) Int. Cl.
| | |
|---|---|
| *H05K 1/09* | (2006.01) |
| *B41M 5/00* | (2006.01) |
| *C09D 11/38* | (2014.01) |
| *B29C 64/118* | (2017.01) |
| *H05K 3/10* | (2006.01) |
| *H05K 3/12* | (2006.01) |

(52) U.S. Cl.
CPC ........... *B41M 5/0064* (2013.01); *C09D 11/38* (2013.01); *C09D 11/52* (2013.01); *H05K 3/105* (2013.01); *B22F 2998/10* (2013.01); *B22F 2999/00* (2013.01); *H05K 1/092* (2013.01); *H05K 3/125* (2013.01); *H05K 3/1283* (2013.01); *H05K 2203/092* (2013.01)

(58) Field of Classification Search
CPC ...... B29C 64/118; H05K 3/105; H05K 1/092; H05K 3/125; H05K 2203/092; H05K 3/1283; B22F 2998/10; B22F 2999/00; Y02P 10/25

See application file for complete search history.

(56) References Cited

U.S. PATENT DOCUMENTS

| | | | |
|---|---|---|---|
| 2011/0048960 A1* | 3/2011 | Sankaran | B82Y 40/00 205/560 |
| 2014/0203223 A1* | 7/2014 | Ikada | H01L 31/1884 252/514 |
| 2015/0274534 A1 | 10/2015 | Sankaran et al. | |
| 2016/0168715 A1* | 6/2016 | Ma | C23C 18/31 174/268 |

OTHER PUBLICATIONS

David Rotman, "Microscale 3-D Printing", "MIT Technology Review", dated May 1, 2014, pp. 1-9.

Vadim Bromberg et al., "Highly conductive lines by plasma-induced conversion of inkjet-printed silver nitrate traces", DOI: 10.1039/c3tc31361a, "Journal of Materials Chemistry C", dated Sep. 3, 2013, pp. 6842-6849, Publisher: The Royal Society of Chemistry.

Souvik Ghosh et al., "Fabrication of Electrically Conductive Metal Patterns at the Surface of Polymer Films by Microplasma-Based Direct Writing", "Applied Materials & Interfaces", Publisher American Chemical Society, dx.doi.org/10.1021/am406005a, Feb. 20, 2014, pp. 3099-3104, vol. 6.

Seung Whan Lee et al., "Direct Writing of Metal Nanoparticles by Localized Plasma Electrochemical Reduction of Metal Cations in Polymer Films", "Advanced Functional Materials", Publisher: WILEY-VCH Verlag GmbH & Co. KGaA, Weinheim, dated 2011, DOI: 10.1002/adfm.201100093, pp. 1-7.

* cited by examiner

COMPOSITION COMPRISING DIRECTLY WRITTEN METAL FEATURES AND METHOD OF FORMATION

CROSS REFERENCE TO RELATED APPLICATIONS

This case claims priority of U.S. Provisional Patent Application Ser. No. 62/485,230, filed Apr. 13, 2017 and U.S. Provisional Patent Application Ser. No. 62/655,456, filed Apr. 10, 2018, each of which is incorporated herein by reference. If there are any contradictions or inconsistencies in language between this application and one or more of the cases that have been incorporated by reference that might affect the interpretation of the claims in this case, the claims in this case should be interpreted to be consistent with the language in this case.

STATEMENT REGARDING FEDERALLY SPONSORED RESEARCH

This invention was made with Government support under CMMI-1246715 awarded by The National Science Foundation. The Government has certain rights in the invention.

TECHNICAL FIELD

The present disclosure relates to techniques, methods, apparatus, and materials pertaining to additive manufacturing and, more particularly, to ink-jet printing of electrically conductive features on a substrate using a particle-free metal-salt-based ink and low-power plasma post-deposition treatment.

BACKGROUND

Historically, electronic-component fabrication has been based on planar processing methods in which a stack of material layers are sequentially deposited and patterned on a semiconductor substrate. A typical material stack includes several dielectric layers (e.g., oxides, nitrides, etc.) as well as several metal layers for establishing electrical contact to individual devices, as well as interconnecting those devices to define electrical circuits.

Proper formation of the patterned metal layers is critical for successful device fabrication. In conventional planar processing, each metal layer is deposited, in blanket form, using a physical vapor deposition (PVD) process, such as thermal or e-beam evaporation or magnetron sputtering.

Once a blanket layer has been deposited, it is patterned by removing unwanted portions of the layer (referred to as subtractive patterning) before the deposition of the next layer. In most cases, the unwanted regions of the metal layer are removed by forming a photoresist mask on the layer that the undesired areas of the metal to a subsequent etch process. In some cases, the metal layer is patterned using a lift-off process wherein the layer is deposited over a pre-patterned layer of photoresist having openings where metal is desired. After layer deposition, the photoresist is dissolved away thereby "lifting" any metal on it and removing it from the substrate. Due to the high-energy nature of the ejected target material in sputter deposition, lift-off techniques cannot normally be used to pattern a sputtered layer.

While conventional subtractive patterning enables excellent pattern fidelity and small feature sizes, it is typically characterized by high material waste. In addition, the need to locate the substrate within an evacuated reaction chamber during evaporative or sputter deposition limits the size of the substrate and adds system cost and complexity. Further, wafer-based processing is inherently low throughput as compared to many modern manufacturing approaches, such as reel-to-reel manufacturing (a.k.a., roll-to-roll manufacturing). Still further, advancements in implantable biosensors, wearable sensors, as well as other applications, is driving a growth in the need for flexible electronics; however, conventional planar processing is normally limited to rigid substrates and not compatible with the polymer or paper substrates desirable for use in flexible electronics. Finally, the evaporative and sputtering processes used for metal deposition in planar processing approaches are characterized by high heat that can be damaging to many flexible substrates.

As a result, there has been a concerted effort to develop additive manufacturing techniques that deposit solution-processed functional materials only where desired. Inkjet printing is a promising candidate for directly written conductors and has been successfully used to manufacture electronic interconnects and devices, sensors, RFID tags and thin-film transistors. Furthermore, it is compatible with large-scale, roll-to-roll manufacturing and, therefore, enables significant cost reductions over more conventional manufacturing techniques. The digitally-driven, direct write nature of ink-jet printing makes it ideally suited for rapid prototyping as well as low volume manufacturing. Perhaps most significantly, inkjet printing is potentially compatible with virtually any substrate since aggressive etchants are not required to generate the pattern. As such, ink-jet printing holds great promise for use in fabricating flexible and recyclable/disposable electronics on polymer and paper substrates.

Inks explored for use in such approaches fall into three main categories—colloidal suspensions of metal nanoparticles, organometallic solutions, and metal-salt solutions. Unfortunately, each type of ink has drawbacks that have, thus far, limited their utility in practical volume manufacturing environments.

Metal nanoparticle colloidal-suspension inks can be expensive due to the number of processing steps associated with synthesis, dispersion, purification, and concentration. In addition, the variety of available materials suitable for printable inks is limited. Furthermore, organic capping agents are typically required to stabilize the suspended metal particles, suppress agglomeration, and improve shelf life. Unfortunately, these can be difficult to remove after deposition and can lead to poor conductivity, compromised mechanical integrity, and a requirement for high annealing temperatures. As a result, their use of many polymers and other temperature-sensitive substrates (e.g., CMOS chips containing electronic devices) is limited. Still further, nanoparticle inks have a tendency to clog the ejector nozzles of an inkjet delivery system.

Organometallic solutions are relatively easy to form into printable inks; however, they typically have a low metal-volume fraction, which gives rise to a need for multi-layer depositions to print features having sufficient thickness.

Metal-salt-based inks have higher metal-volume fraction, which mitigates the need for multi-layer depositions. Unfortunately, many prior-art metal-salt-based ink deposition processes require high vacuum, complex equipment, and conductive substrates. In addition, they are normally characterized by relatively low throughput due, in part, to long post-deposition treatments required to remove the non-metallic components of the ink and decompose the metal salt into pure metal. Typical post-deposition treatment include annealing at high temperatures (e.g., >400° C.) to thermally decompose the metal salt, exposing the ink to a reducing vapor (e.g., ethylene glycol, etc.) at an elevated temperature, or exposing the deposited ink to a reducing agent, such as ascorbic acid. Unfortunately, such treatments either subject the ink and its substrate to high temperatures or provide only limited control of the conversion process from metal salt to metal. These issues remain as critical obstacles to large-scale production and wide-scale adoption of colloidal inks for direct-write electronics.

To overcome some of the drawbacks of printing features using metal-salt-based inks, a low-temperature process that enables more rapid conversion of the metal salt in a deposited ink to pure metal was developed, as reported by Bromberg, et al., in "Highly conductive lines by plasma-induced conversion of inkjet-printed silver nitrate traces," in *J. Mater. Chem. C*, Vol. 1, pp. 6842-6849 (2013). In this approach, the substrate and its deposited ink pattern are exposed to a post-deposition plasma treatment in which an energetic plasma of argon gas is used to drive the conversion process. Unfortunately, while the process reduces the temperature and/or time required for conversion of the metal salt to metal, the approach results in features that are non-uniform through their thickness, provides only limited control over the material parameters of the resultant material, and can give rise to feature broadening due to redeposition of ink material onto previously uncoated field regions of the substrate.

The need for a direct-write, additive process for producing patterned material layers having controlled material parameters on a wide variety of flexible and rigid substrates remains, as yet, unmet in the prior art.

SUMMARY

The present disclosure enables directly written metal features on a wide range of substrates without some of the costs and disadvantages of the prior art. In accordance with the present disclosure, metal features can be directly written on a substrate such that the morphology of the written feature is substantially consistent through its thickness, and where one or more material parameters of the metal, such as porosity, surface-area-to-volume ratio, internal stress, and/or effective resistivity, can be controlled. Furthermore, in some embodiments, at least one of these material parameters can be controlled locally such that it is different in different regions of the same feature, different in different features on the same substrate, and the like. Embodiments in accordance with the present disclosure are particularly well suited for use in flexible electronics, sensors, paper electronics, and biosensing systems.

Like the prior art, embodiments in accordance with the present disclosure employ inkjet deposition of a metal-salt-based ink followed by a post-deposition plasma treatment to remove the non-metallic components of the ink and decompose its metal salt into pure metal. The metal-salt-based inks employed in the prior art are aqueous solutions of silver nitrate dissolved in pure water. Furthermore, prior-art plasma treatment is performed on the entire substrate while it is held in a conventional plasma-treatment system.

In sharp contrast to the prior art, metal-salt-based inks in accordance with the present disclosure are particle-free solutions of a metal salt dissolved in a multi-part solvent, where at least one property (e.g., viscosity, surface tension, and/or evaporation rate) of at least two components of the solvent is different. The use of such a multi-part solvent affords distinct advantages over the prior art, including:

i. slower solvent evaporation during pattern writing, which enables larger and/or more complex patterns to be written prior to post-deposition treatment, improved layer morphology due to reduced evaporatively driven solidification, and/or substantially uniform structure through the thickness of the layer; or ii. greater control over the morphology and/or material parameters of the resultant features through their thickness; or iii. control over the porosity of the resultant features; or iv. control over the surface-area-to-volume ratio of the resultant features; or v. any combination of i, ii, iii, and iv.

In addition, because the prior-art employs a post-deposition treatment that is performed on the entire substrate at one time, all written features experience the same post-deposition conditions. As a result, all of the resultant metal features have substantially the same material parameters. Furthermore, because the entire substrate surface is exposed to the plasma, exposed field regions of the substrate can be damaged by the plasma.

In some embodiments in accordance with the present invention, however, post-deposition treatment of written features is performed using an atmospheric-pressure microplasma characterized by a narrow beam that can be controllably scanned over the surface of the substrate while its power is controlled. As a result, the post-deposition treatment can be varied over the substrate surface as desired thereby enabling different features (or different regions within the same feature) to have markedly different material parameters, such as porosity, surface-area-to-volume ratio, internal stress, and/or effective resistivity. Furthermore, the metal-salt within a treated region can be completely converted to pure metal at lower power, mitigating sputtering and redeposition that is known to occur using prior-art plasma treatments.

An illustrative embodiment is a method for forming metal features on a substrate, wherein inkjet printing is used to deposit a pattern of ink on the top surface of the substrate. The ink comprises a metal-salt solution of silver nitrate dissolved in a three-part solvent of water, ethanol, and ethylene glycol. After the nascent features of the pattern are formed, the substrate is loaded into a conventional plasma reactor and exposed to a controlled plasma to remove the non-metallic components of the ink and convert the silver salt into pure silver metal. The reduced silver in the resultant features has substantially the same resistivity as bulk silver; however, each feature is characterized by a uniform porosity that is greater than zero through its thickness. In other words, the lines are characterized by a framework of substantially pure silver that includes a plurality of voids that extend, preferably substantially uniformly, through the entire thickness of the feature. As a result, each feature has an effective resistivity that is higher than that of bulk silver even while the resistivity of its constituent material is substantially equal to the resistivity of bulk silver. The density of voids can be controlled by controlling the plasma parameters during their post-deposition treatment and/or the concentration of metal salt in the solvent system. In some embodiments, the features include a metal other than silver, such as gold, nickel, tin, lead, bismuth, copper, platinum, and/or palladium.

In some embodiments, nascent features are written on a substrate via inkjet printing and reduced and sintered using a microplasma that is characterized by a narrow beam shape that can be scanned over the nascent features while its power is controlled. In such embodiments, different features on the same substrate can have different material parameters (e.g., porosity and first effective resistivity). In addition, by changing the plasma parameters within the extent of a single feature, the feature can be formed such that it has a first region having a first set of material parameters and a second region having a second set of material parameters that differ from the first set.

In some embodiments, the substrate comprises a temperature-sensitive material other than paper, such as a polymer, etc. In some embodiments, the substrate comprises a conventional planar-processing substrate, such as silicon, glass, a compound semiconductor, and the like. In some embodiments, the substrate comprises a material that is chemically sensitive, such as a biological material, organic material, polymers, etc.

An embodiment in accordance with the present disclosure is a composition comprising: a substrate; and a first layer disposed on the substrate, the first layer having a first thickness, wherein the first layer includes a first material that is a first metal, and wherein the first material has a material resistivity that is substantially equal to the bulk resistivity of the first metal, and wherein the first layer includes a first region having a plurality of voids that extend through the first thickness such that the first region that is characterized by a first effective resistivity that is less than the bulk resistivity.

Another embodiment in accordance with the present disclosure is a method comprising: providing an ink that is substantially particle-free and includes a first metal salt dissolved in a solvent, wherein the solvent includes a plurality of components, and at least one property of at least two components of the plurality thereof is different, the property being selected from the group consisting of viscosity, surface tension, and evaporation rate; inkjet printing a first pattern of the ink on a substrate; and exposing at least a first region of the first pattern to a plasma that is operative for converting the first metal salt into a first metal.

Yet another embodiment in accordance with the present disclosure is a method comprising: forming a first pattern of ink on a substrate, the ink being a metal-salt-based solution that is substantially particle-free and the first pattern being defined via inkjet printing; and exposing a first region of the first pattern to a plasma that is operative for converting the first metal salt into a first metal having a material resistivity substantially equal to the bulk resistivity of the first metal; wherein the first region is substantially homogeneous and includes a framework of the first metal having a plurality of voids that is distributed through the thickness of the first region; and wherein the first region has an effective resistivity that is greater than the bulk resistivity of the first metal.

DETAILED DESCRIPTION

The following terms are defined for use in this Specification, including the appended claims:
  material resistivity is defined as the resistivity of a solid region of a material.
  effective resistivity is defined as the resistivity of a region of material as measured based on the complete thickness of the region. For example, a layer having a porosity greater than zero might have a framework of solid regions of a first material, where the solid regions are characterized by a material resistivity; however, the entire layer is characterized by a resistivity greater than this material resistivity because the material layer is not solid through its thickness.
  temperature-sensitive substrate is defined as a substrate whose quality is irreversibly negatively affected by exposure to temperatures greater than 150° C. Examples of temperature-sensitive substrates include paper substrates, polyimide substrates, vinyl substrates, cellophane substrates, and the like.
  chemically sensitive substrate is defined as a substrate whose quality is irreversibly negatively affected by exposure to a chemical.

Figure 1:
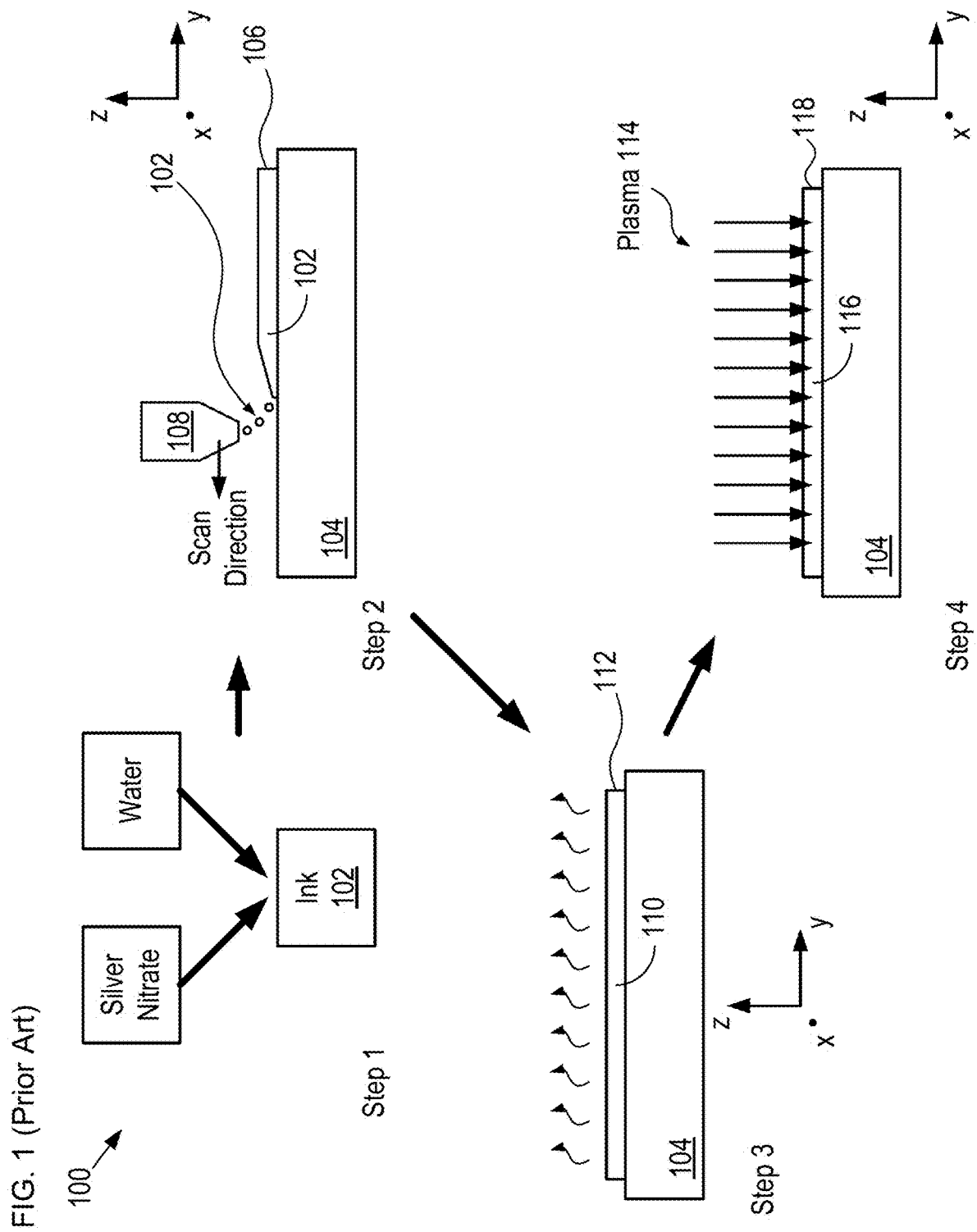
FIG. 1 is a pictorial representation of an inkjet printing process suitable for forming a silver-based conductive feature in accordance with the prior art.

FIG. 1 is a pictorial representation of an inkjet printing process suitable for forming a silver-based conductive feature in accordance with the prior art. The printing process shown in FIG. 1 is analogous to that described by Bromberg, et al., in "Highly conductive lines by plasma-induced conversion of inkjet-printed silver nitrate traces," in *J. Mater. Chem. C*, Vol. 1, pp. 6842-6849 (2013), which is incorporated herein by reference.

Process 100 begins with Step 1, in which ink 102 is formed by dissolving silver nitrate in pure water.

In Step 2, inkjet printer 108 writes a line of ink 102 to form rivulet 106 on glass substrate 104.

In Step 3, once the pattern of ink is fully formed, the water in ink 102 is allowed to fully evaporate, converting the ink into material 110 and rivulet 106 into nascent feature 112. Material 110 is characterized by a line of dendritic crystals of silver nitrate of various sizes and morphology. It should be noted that the water-evaporation and solidification process does not occur uniformly over the entire length of rivulet 106 but, instead, progresses from the rivulet tip formed last to first point written due to convective flow. Unfortunately, this gives rise to a distinct non-uniformity in the silver nitrate structure of nascent feature 112 that results in significant non-homogeneity in the structure of completed feature 118.

Figure 2A:
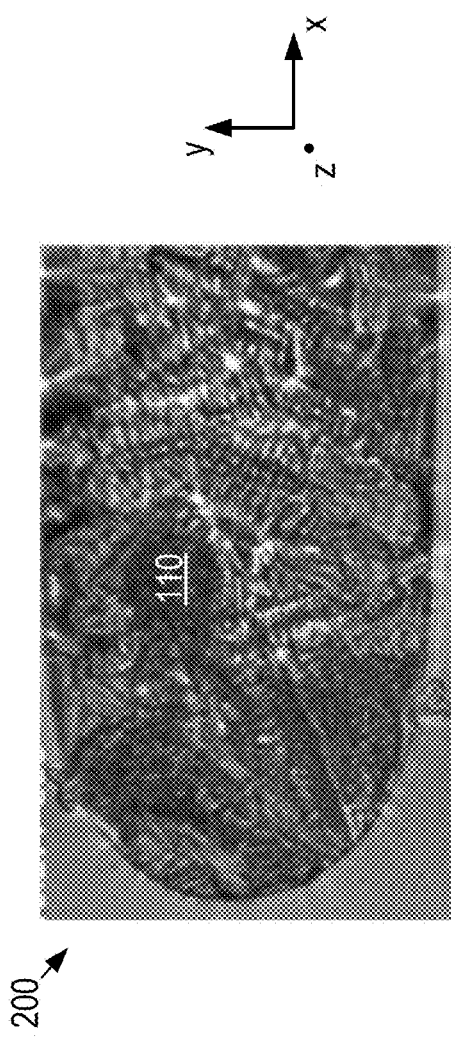
FIG. 2A depicts a magnified view of the dendritic structure of solidified rivulet 106.

FIG. 2A depicts a magnified view of the dendritic structure of solidified rivulet 106. As can be seen in image 200, the dendritic growth in material 110 is distinctly non-uniform and has a higher density near the tip of the rivulet.

Returning now to FIG. 1, in Step 4, material 110 is treated with plasma 114, which is an argon plasma having plasma power within the range of 100 W to 900 W. The plasma treatment removes non-metallic components from material 110 and converts silver nitrate into pure silver. In Step 4, material 110 is converted into material 116 thereby completing feature 118.

Unfortunately, the solid dendritic structure of material 110 inhibits the penetration of the plasma energy into the bulk of nascent feature 112.

Figure 2B:
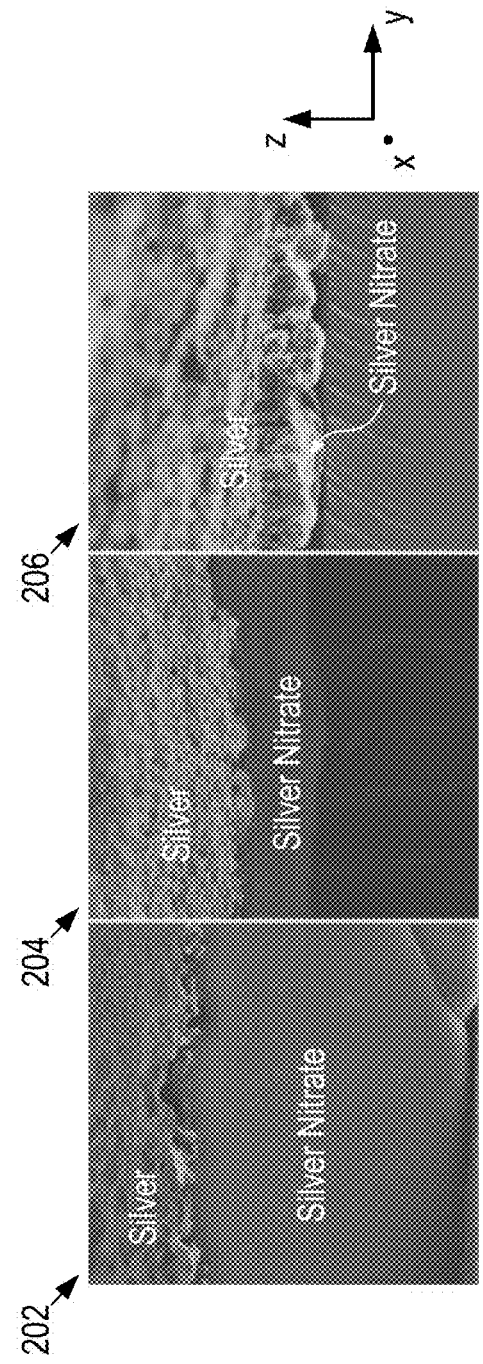
FIG. 2B depicts a magnified cross-sectional views of metal features formed in accordance with the prior art.

FIG. 2B depicts a magnified cross-sectional views of metal features formed in accordance with the prior art. Images 202, 204, and 206 show cross-sectional views of a metal feature, analogous to feature 118, after plasma treatment at plasma powers of 100 W, 500 W, and 900 W, respectively.

As evinced by the images, the conversion of silver nitrate into pure silver occurs primarily only near the surface of the nascent feature, which leads to features having a distinctly non-uniform morphology that includes a surface "skin" of pure metal (i.e., silver) disposed on unconverted metal salt (i.e., silver nitrate).

As can be seen in image 206, at very high plasma power, nearly complete conversion of the silver nitrate can be achieved. Unfortunately, treatment at such high plasma power has some distinct disadvantages. First, it can lead to significant heating of substrate 104, making such treatment unsuitable for use with temperature-sensitive substrates, such as paper, polymers, etc. Second, high plasma power gives rise to sputtering of material from the top surface of feature 118. The sputtered metal then redeposits in the field regions of the substrate (i.e., the regions not covered by features). This redeposition can lead to line broadening, shorts, and other undesirable effects.

Figure 2C:
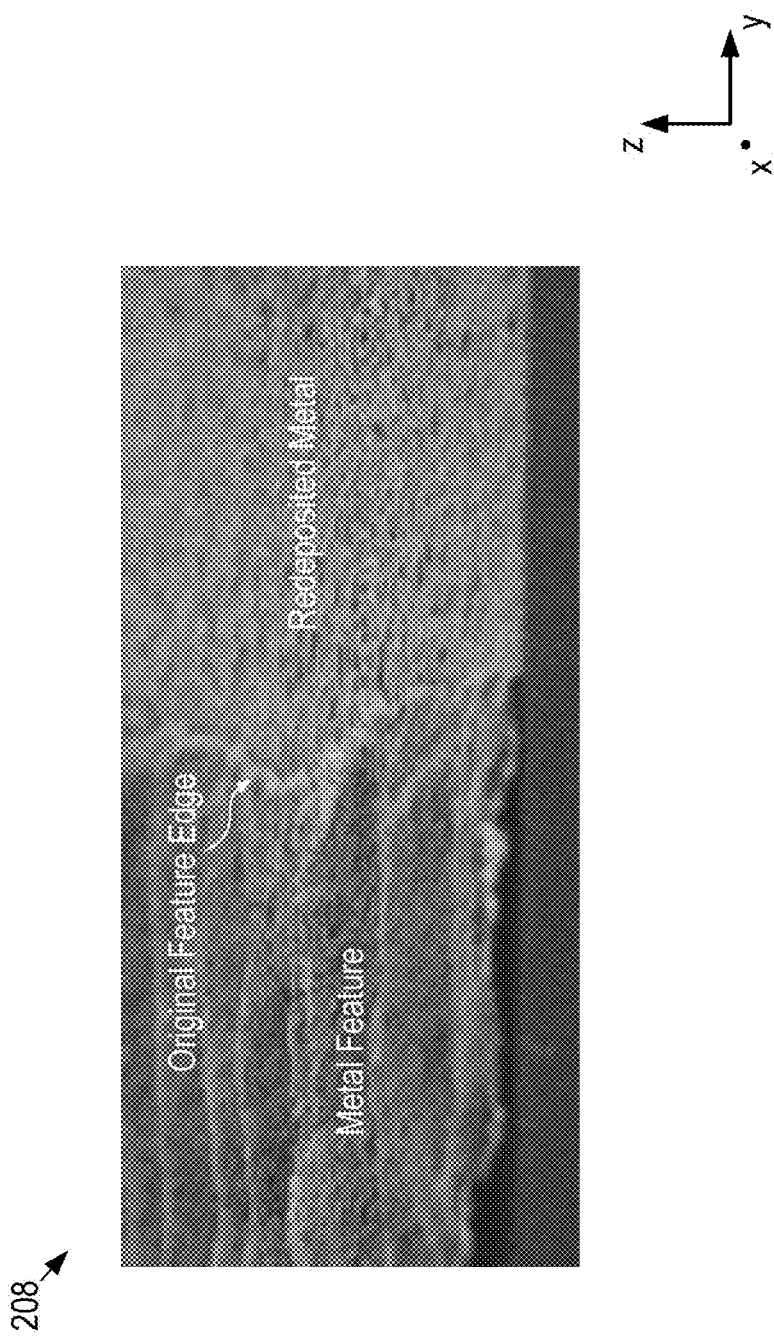
FIG. 2C depicts a magnified cross-sectional views of a portion of a metal feature formed in accordance with the prior art after treatment with a 900 W plasma.

FIG. 2C depicts a magnified cross-sectional views of a portion of a metal feature formed in accordance with the prior art after treatment with a 900 W plasma. Significant roughening of the top surface of the metal feature can be seen, as well as redeposition of the sputtered material outside the limits of the original feature.

Like the prior art, the present disclosure enables formation of a pattern of metal features by inkjet writing a particle-free metal-salt-based ink on a substrate and treating the deposited ink with plasma to remove unwanted components in the ink and convert the metal salt to pure metal. In contrast to the prior art, however, embodiments in accordance with the present disclosure employ inks in which the metal salt is dissolved in a multi-part solvent whose components have at least one property (e.g., evaporation rate, surface tension, or viscosity) that is different.

Figure 3:
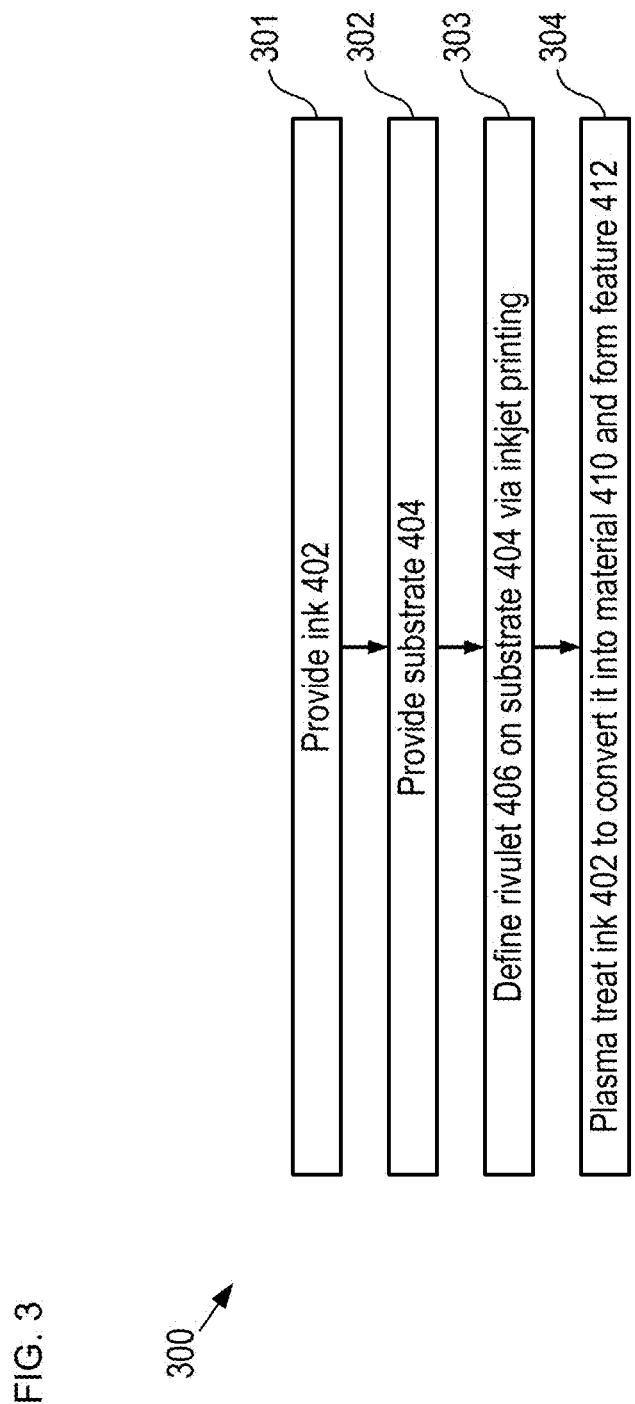
FIG. 3 depicts operations of a method suitable for forming an electronic element in accordance with an illustrative embodiment of the present disclosure.

FIG. 3 depicts operations of a method suitable for forming an electronic element in accordance with an illustrative embodiment of the present disclosure. Method 300 is described herein with reference to FIGS. 4A-C.

Figure 4:
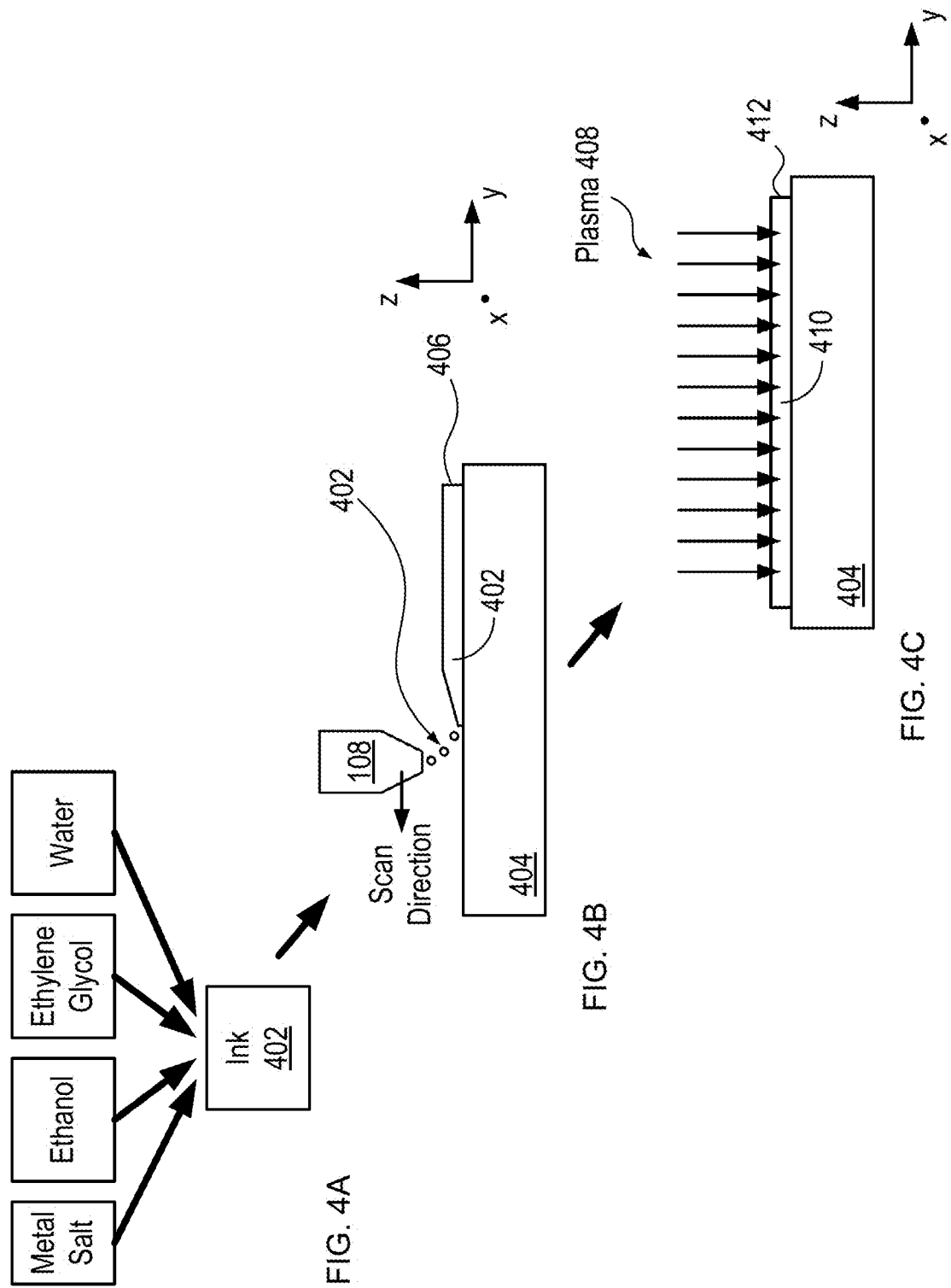
FIG. 4A-C depict different stages of an inkjet printing process suitable for forming an electronic element in accordance with the illustrative embodiment.

FIG. 4A-C depict different stages of an inkjet printing process suitable for forming an electronic element in accordance with the illustrative embodiment.

Method 300 begins with operation 301, wherein ink 402 is provided as a substantially particle-free solution of metal-salt dissolved in a multi-part solvent. In the depicted example, ink 402 is provided by dissolving 6.12 g of silver nitrate ($AgNO_3$) crystals in a solution that includes 7 ml of ethanol, 3 ml of deionized water and 20 ml of ethylene glycol to yield an ink having a 1.2 M concentration of silver nitrate. The properties of the ink solvent (i.e., viscosity, surface tension, and evaporation rate) are selected, in part based on the requirements of the printer nozzle used to dispense the ink on substrate 404. As such, the values provided here for the components of ink 402 merely represent a non-limiting example of a suitable ink solution.

FIG. 4A depicts the formation of ink 402 in accordance with the illustrative embodiment.

It should be noted that other metal salts can be dissolved in multi-part solvent mixtures to form ink 402 without departing from the scope of the present disclosure. Non-limiting examples of alternative formulations suitable for ink 402 include: (a) 1 M $CuSO_4$ dissolved in water, which is then mixed with ethylene glycol in a 1:1 ratio; (b) 1 M $SnCl_2$ dissolved in ethanol, which is then mixed with ethylene glycol in a 1:1 ratio; and (c) 1M chlorauric acid ($HAuCl_4$) dissolved in a two-part solvent of 1:1 water and ethylene glycol. Many other suitable ink solutions will be apparent to one skilled in the art after reading this disclosure.

Furthermore, while the depicted example employs a solvent that is a mixture of ethanol, ethylene glycol, and water, other solvent mixtures in accordance with the present disclosure can include solvent components of different chemicals either as substitutes for, or in addition to, one or more of ethanol, ethylene glycol, and water.

Preferably, ink 402 includes a solvent having a first constituent that is a replacement for a surfactant often used in prior-art ink formulations to mitigate nanoparticle agglomeration. It is desirable that the first constituent reduce the surface tension of the ink, while a second constituent in the solvent controls the viscosity of the ink. These constituents are normally selected such that they are compatible and miscible and do not give rise to auto-reduction of the metal salt included in the ink. In some embodiments, ink 402 employs a solvent that includes at least one alcohol (e.g., ethanol, methanol, etc.) or organic solvent (e.g., acetone, trichloroethane, trichloroethylene, etc.), and at least one glycol (e.g., ethylene glycol, glycerin, glycerol, propylene glycol, etc.). Key attributes for the ink solvent constituents is that, preferably, they can dissolve the metal salt, they are non-reactive with each other and the metal salt so no chemical reactions occur in solution, are non-reactive with the materials of the inkjet printer, and they are non-reactive with the materials of substrate 404.

The constituents of the solvent are mixed in concentrations suitable for providing ink 402 with a viscosity within the range of approximately 1 to approximately 1000 cP and a surface tension within the range of approximately 20 to approximately 70 dynes/cm. The preferred viscosity and surface tension of ink 402 are typically based on the type of inkjet printer used to dispense the ink. For example, the illustrative embodiment employs a DMP-3000 inkjet printing system from Fuji Film, Inc. to dispense ink 402. Using this printer, proper dispensation of ink 402 is achieved for an ink having a viscosity within the range of approximately 10 to approximately 12 cP and a surface tension within the range of approximately 28 to approximately 33 dynes/cm. Alternatively, dispensing ink 402 using a jetlab® 4 system from MicroFab Technologies, Inc. requires that the ink has a viscosity of <20 cP and a surface tension of 20-70 dynes/cm. It will be apparent to one skilled in the art, after reading this Specification, that the values for viscosity and surface tension can vary over a wide range depending upon the inkjet printing technology employed (e.g., piezoelectric, pneumatic, aerosol jet, etc.).

Examples of alternative metal salts suitable for use in embodiments in accordance with the present disclosure include, without limitation, nickel chloride ($NiCl_2$), tin chloride ($SnCl_2$), lead chloride ($PbCl_2$), bismuth chloride ($BiCl_3$), copper sulfate ($CuSO_4$), chloroplatinic acid ($H_2PtCl_6$), palladium chloride ($PdCl_2$), chlorauric acid ($HAuCl_4$), and the like.

At operation 302, substrate 404 is provided.

Substrate 404 is a paper substrate suitable for use in disposable electronics. In some embodiments, substrate 404 comprises one or more materials other than paper, such as polymers, glasses, dielectrics, composite materials, semiconductors, ceramics, and the like. In some embodiments, substrate 404 is a substrate suitable for use in conventional planar processing (e.g., integrated-circuit fabrication, etc.). In some embodiments, substrate 404 is a substrate suitable for use in a different mass manufacturing approach, such as roll-to-roll processing, reel-to-reel processing, and the like. It should be noted that the teachings of the present disclosure are compatible with virtually any substrate, including temperature-sensitive substrates and chemically sensitive substrates.

At operation 303, a pattern of ink 402 is written on the top surface of substrate 404. Ink 402 is dispensed by inkjet printer 108, which is scanned along a path appropriate for forming the desired pattern. In the depicted example, the written pattern of ink results in rivulet 406.

FIG. 4B depicts a schematic drawing of a cross-section of the nascent electronic element during the formation of rivulet 406.

In marked contrast to the inkjet printing process depicted in FIG. 1, method 400 does not include a drying step so that, at least a portion of the solvent of ink 402 remains in rivulet 406 during subsequent plasma treatment. This has affords several advantages to embodiments in accordance with the present disclosure:
  i. larger and/or more complex patterns can be written on substrate 404 prior to post-deposition treatment; or
  ii. the layer morphology of the resultant metal features is improved due to mitigation of evaporatively driven solidification; or
  iii. greater penetration depth of the plasma energy during plasma-based post-deposition treatment; or
  iv. more uniform structure through the thickness of the layer as compared to the prior art; or
  v. greater control over the morphology and/or material parameters of the resultant features through their thickness; or
  vi. any combination of i, ii, iii, iv, and v.

At operation 304, ink 402 is exposed to plasma 408, which converts ink 402 into material 410 by removing the non-metallic components of the ink and converting its metal salt into pure metal. As a result, rivulet 406 is converted into feature 412.

FIG. 4C depicts a schematic drawing of a cross-section of the nascent electronic element during the plasma treatment of ink 402.

In the depicted example, plasma 408 is an argon plasma generated in a conventional plasma chamber. In the depicted example, post treatment of ink 402 is performed at a power of 200 W in a background pressure of 613 mTorr for 20 minutes.

At the conclusion of operation 404, the metal salt in ink 402 is completely converted to a substantially homogeneous morphology characterized by a framework of pure metal, where the framework includes a distribution of voids that extend through the entire thickness of feature 412.

Figure 5:
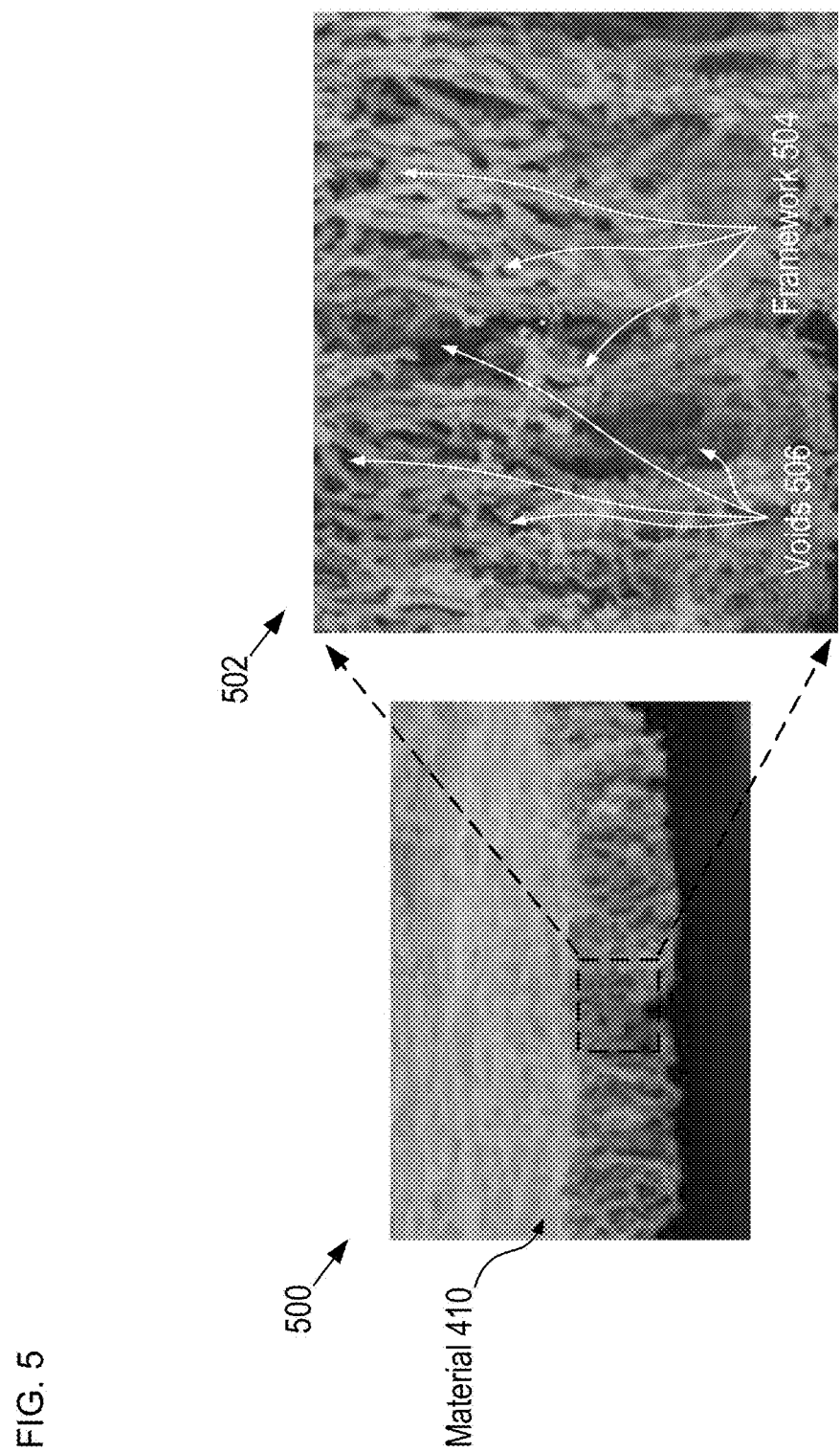
FIG. 5 depicts a scanning-electron microscope image of a cross-sectional view of material 410.

FIG. 5 depicts a scanning-electron microscope image of a cross-sectional view of material 410. Images 500 and 502 show the cross-sectional view of material 410 at low and high magnification, respectively.

Images 500 and 502 evince that material 410 has a percolated network morphology characterized by an internal structure of framework 504, which comprises interlocking threads of pure metal with a plurality of voids 506, where the voids are distributed throughout the entire thickness of the material. As a result, material 410 is substantially homogeneous.

Comparing images 500 and 502 with images 202, 204, and 206 described above and with respect to the prior art shows that methods in accordance with the present disclosure yield metal features having more uniform morphology through their thickness and more predictable material parameters than metal features formed using prior-art methods.

It should be noted that the metal that composes the threads of framework 504 has a material resistivity that is substantially equal to the bulk resistivity of that metal, material 410 is characterized by an effective resistivity that is higher than this bulk resistivity because of its porosity, which yields an effective conductive cross-sectional area (i.e., the area of the conductive material within the cross-section) that is smaller than the physical cross-sectional area of the feature itself. It should be further noted that the porosity of material 410 also determines the surface-area-to-volume ratio for a feature comprising the material. This affords embodiments in accordance with the present disclosure distinct advantages when used in many applications, such as environmental sensors, biological sensors, and the like.

It is another aspect of the present disclosure that at least one the porosity, effective resistivity, and surface-area-to-volume ratio of an inkjet deposited metal feature can be controlled by controlling the parameters (e.g., plasma power and/or chamber pressure) of the plasma treatment used to convert the metal salt in the ink used to form the feature into metal.

Figure 6A:
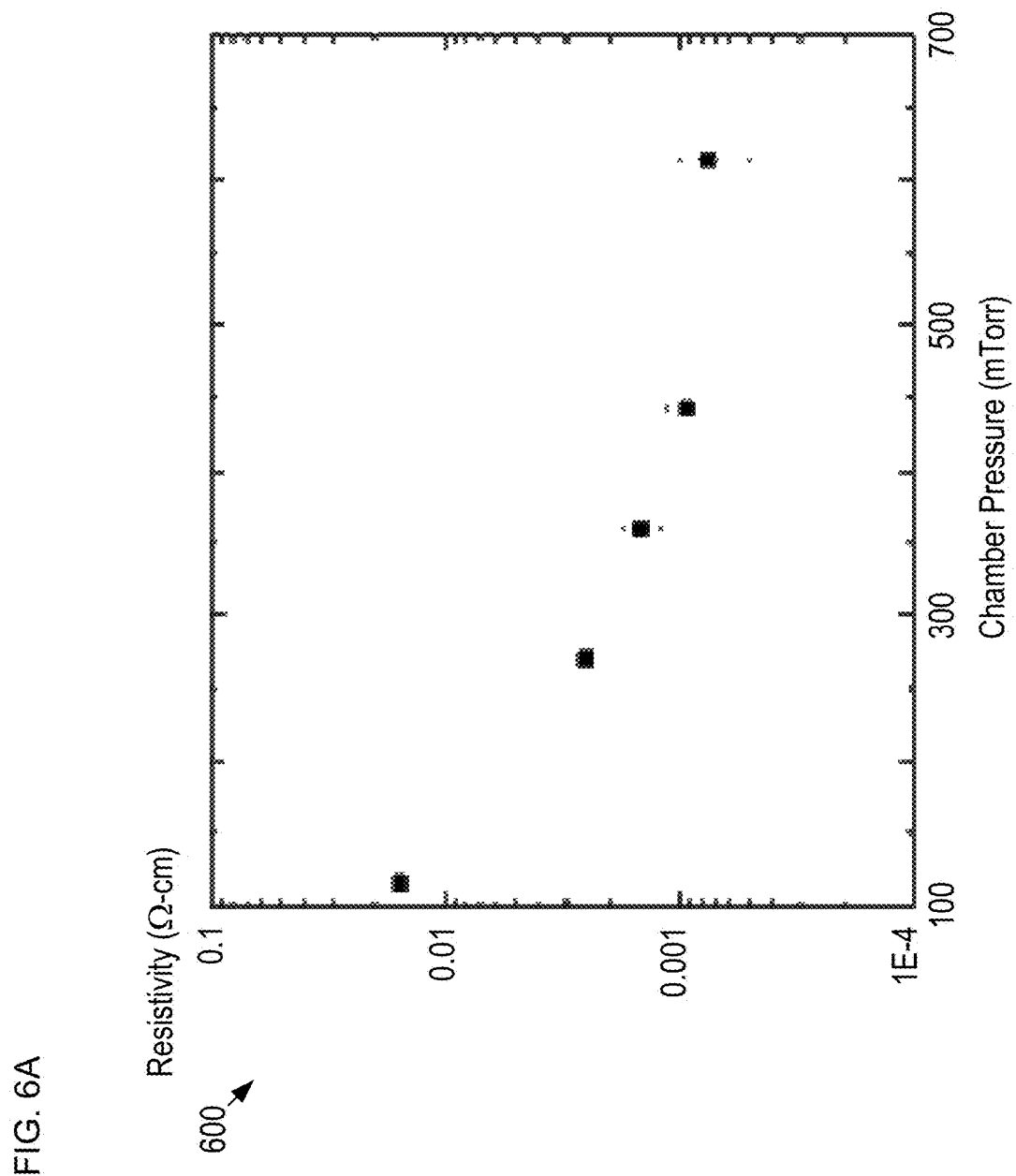
FIG. 6A depicts a plot of effective resistivity of material 410 as a function of the pressure of the plasma chamber during plasma treatment of ink 402.

FIG. 6A depicts a plot of effective resistivity of material 410 as a function of the pressure of the plasma chamber during plasma treatment of ink 402. Plot 600 shows that the effective resistivity decreases with increasing chamber pressure. The data shown in plot 600 was obtained for metal features treated using a 200 W plasma for a duration of 20 minutes.

The relationship between effective resistivity and chamber pressure is due to the fact that, during the printing process, jetted droplets form metal-salt crystallites on substrate 404 as the solvent in ink 402 leaves the ink solution. When exposed to plasma 408, silver ions (i.e., $Ag^+$) in these crystallites are reduced to $Ag^0$ at the surface of the crystallites. With increasing plasma exposure time, reduction proceeds further into the printed structure and simultaneously the reduced $Ag^0$ agglomerates into crystalline and percolated metallic macrostructures. At a higher chamber pressure, the density of the charged species in the plasma is subsequently higher and, therefore, a larger number of electrons are available to engage in electrochemical reduction. Consequently, for the same exposure time, lower effective resistivity can be obtained by performing the plasma treatment at a higher chamber pressure.

It should be noted that the interaction of charged species from a plasma is typically limited to the surface of a structure. For very short exposure times, therefore, $Ag^+$ at the surface of the features is reduced but $AgNO_3$ in the bulk of the structure remains unaffected. However, for longer exposure times and higher powers, the depth at which reduction occurs increases and the macroscopic crystals of $AgNO_3$ fuse to form homogeneous and percolated electrically conducting features.

Figure 6B:
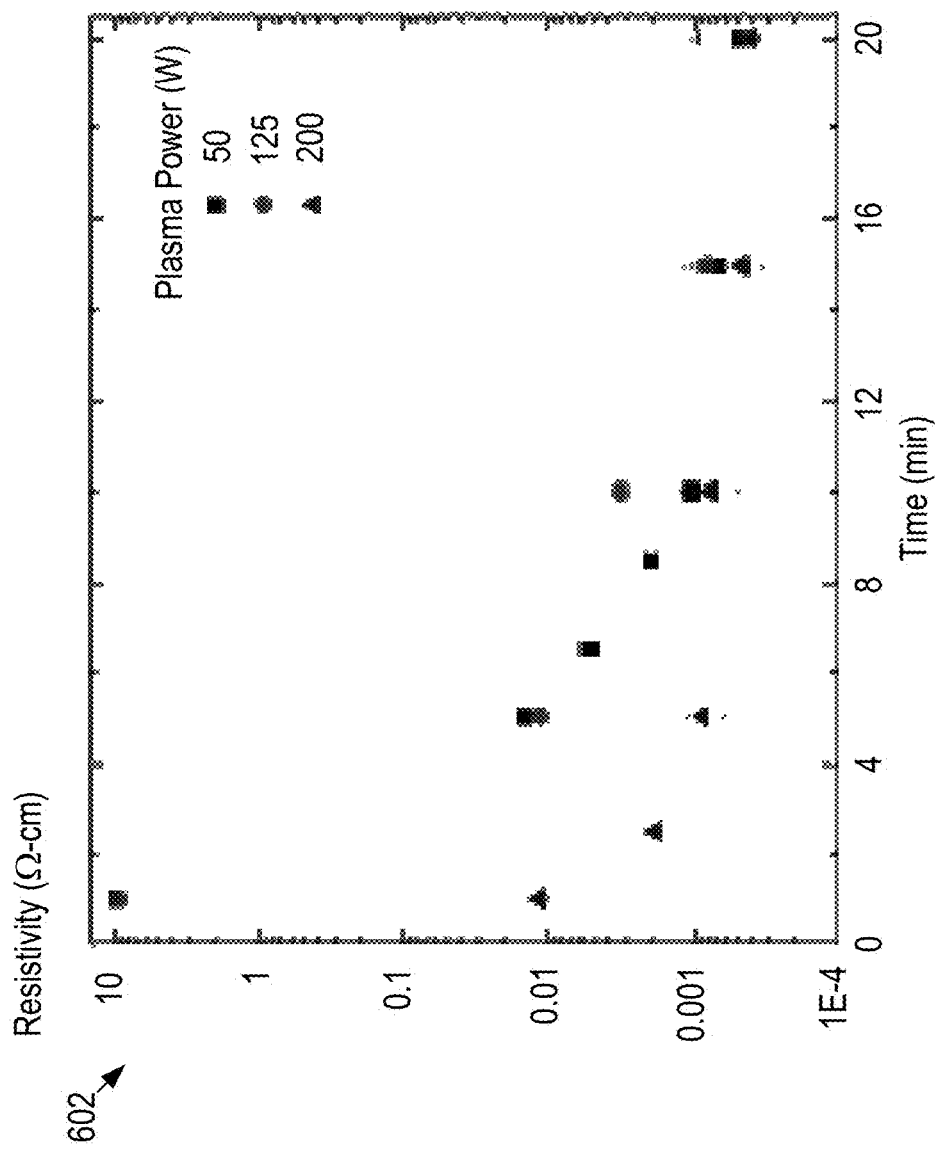
FIG. 6B depicts a plot of effective resistivity of material 410 as a function of plasma power and exposure time.

FIG. 6B depicts a plot of effective resistivity of material 410 as a function of plasma power and exposure time. Plot 602 shows that the effective resistivity decreases as the exposure time is increased, as well as for increasing plasma power.

For a relatively short exposure time of 1 min, the resistivity of the features exposed to 50 and 200 W plasma power are 10 and 0.01 Ω-cm respectively. For an exposure time of 10 min, the resistivity of the features is 1 and 0.8 mΩ-cm, respectively. Since a higher operating pressure gives rise to a higher density of charged species in the plasma, a lower resistivity can be achieved for the same exposure time. Furthermore, a relatively higher plasma power is able to reduce and percolate crystalline silver structures at a faster rate than a relatively lower power plasma.

It should be noted that higher plasma powers and long exposure times can increase surface temperature of substrate 404. For temperature-sensitive substrates, it is preferable to use a longer exposure time and a low plasma power.

Figure 7:
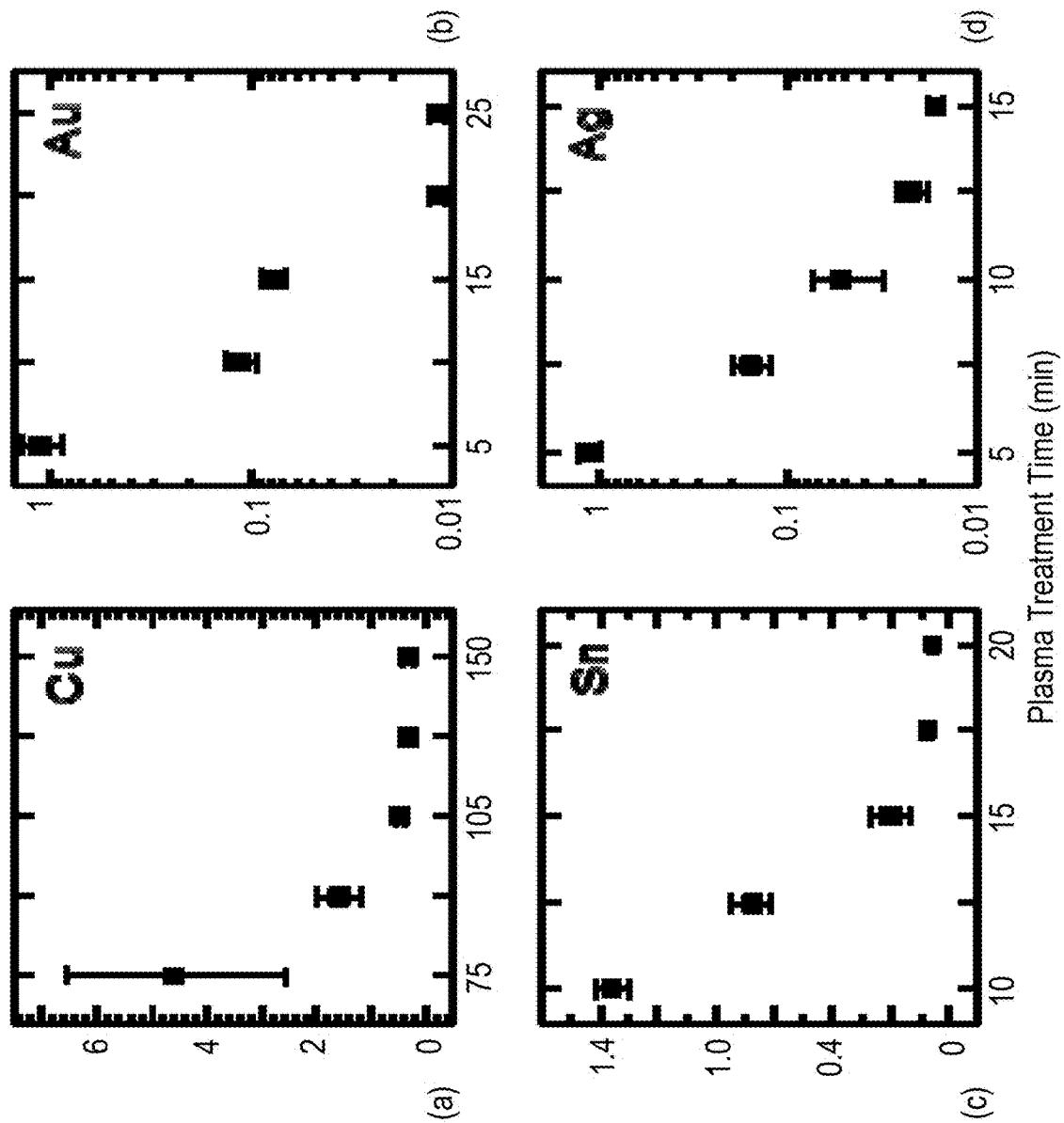
FIG. 7 depicts plots of sheet resistance as a function of plasma-treatment duration for different inkjet-deposited materials in accordance with the present disclosure.

FIG. 7 depicts plots of sheet resistance as a function of plasma-treatment duration for different inkjet-deposited materials in accordance with the present disclosure. The data shown in plots 700(a), (b), (c), and (d) was taken by four-point-probe measurements on square features of inkjet-deposited copper, gold, tin, and silver, respectively, for samples that were plasma treated for different times.

It should be noted that the power required for reducing a metal salt to pure metal is a function of reduction potential. For example, the plasma power required to treat the copper- and tin-based inks was 300 W, while the plasma power required to treat the gold- and silver-based inks was only 150 W. However, in every case, low sheet resistance was achieved at a plasma power level suitable for use with temperature-sensitive substrates.

It is another aspect of the present disclosure that different features and/or regions within a single feature can be formed such that they exhibit different material parameters. To achieve a diversity of material parameters, a microplasma having a substantially "beam-shaped" plasma can be scanned over the ink pattern formed on a substrate while controlling the plasma power used to treat the ink.

Figure 8:
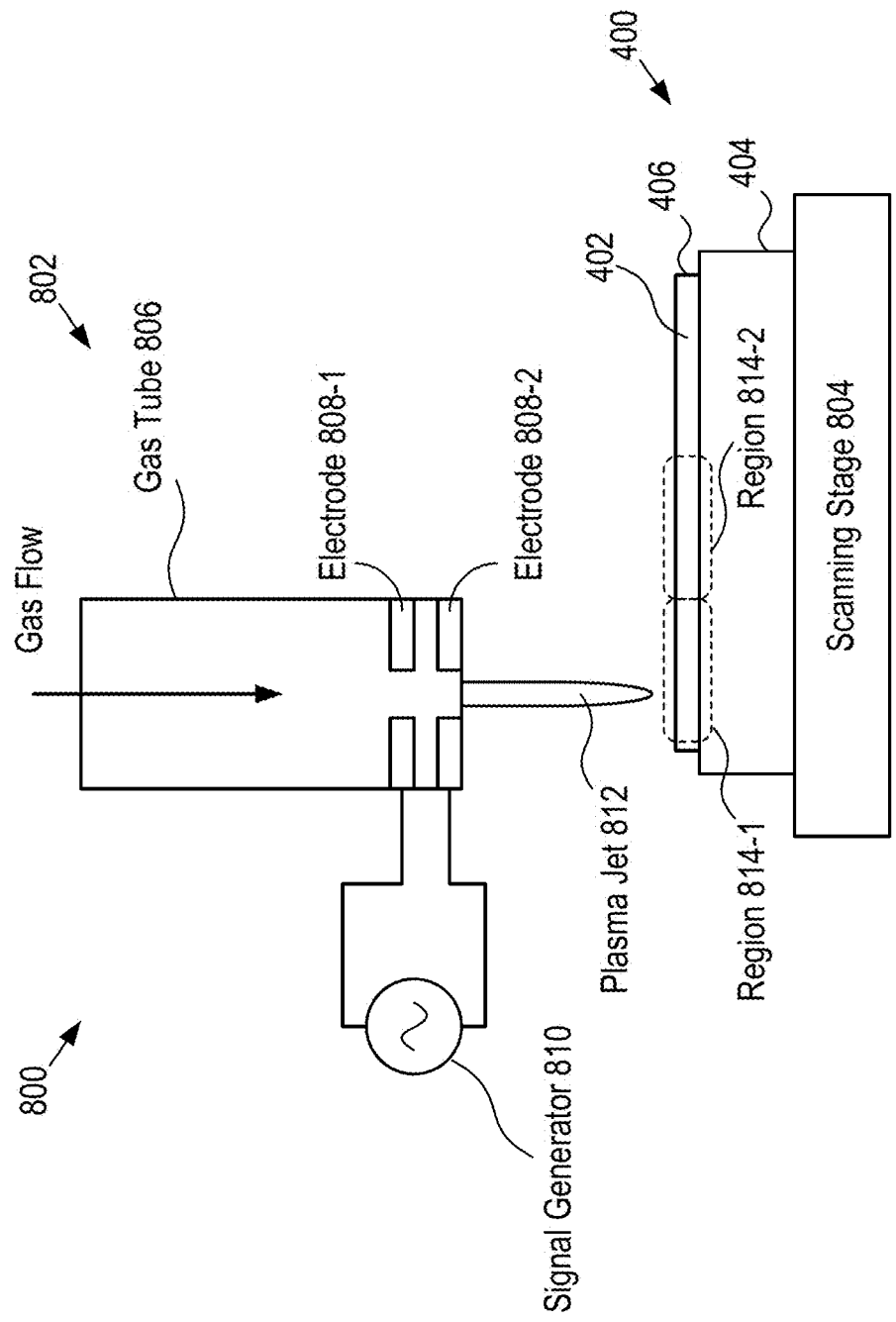
FIG. 8 depicts a schematic drawing of a microplasma system suitable for use in embodiments of the present invention.

FIG. 8 depicts a schematic drawing of a microplasma system suitable for use in embodiments of the present invention. System 800 is a plasma-jet treatment system comprising plasma-jet system 802 and scanning stage 804.

Plasma-jet system 802 includes gas tube 806, electrodes 808-1 and 808-2, and signal generator 810. Examples of plasma-jet systems suitable for use in accordance with the present disclosure are disclosed by Laroussi, et al., in "Room Temperature Atmospheric Pressure Plasma Plume for Biomedical Applications", *Applied Physics Letters*, Vol. 87, pg. 113902 (2005).

Gas tube is a dielectric tube suitable for conveying a gas (e.g., argon, helium, etc.) to electrodes 808-1 and 808-2. When a high-voltage signal (e.g., an RF signal, high-voltage pulses at kHz repetition rate, etc.) is applied between the electrodes, plasma jet 812 is generated such that the plasma has a substantially "beam-like" shape. As a result, the interaction region between the plasma and ink 402 is localized to a very small area.

Nascent element 400 is disposed on a scanning stage that enables the relative positions of plasma jet 812 and the pattern of ink 402 to be controlled. By scanning nascent element 400 while controlling the plasma parameters of plasma jet 812, regions 814-1 and 814-2 can be converted to material 410 such that each region has different porosity, surface-to-volume ratio, and/or effective resistivity.

It should be noted that plasma-jet system 800 is merely one example of a microplasma suitable for use in embodiments in accordance with the present disclosure. Other suitable microplasma systems are described by Shimizu, et al., in "Surface Treatment of Polymer Film by Atmospheric Pulsed Microplasma: Study on Gas Humidity Effect for Improving the Hydrophilic Property," in *Jpn. J. Appl. Phys.*, Vol. 50, 08KA03 (2011), Isbary, et al., in "Non-thermal plasma—More than five years of clinical experience," in *Clinical Plasma Medicine*, Vol. 1, pp. 19-23 (2013), and R. M. Sankaran in U.S. Pat. No. 8,529,749, issued Sep. 10, 2013, each of which is incorporated herein by reference.

In some embodiments, a microplasma for treating an inkjet-deposited ink is enabled by locating nascent element 400 on a platen that serves as one electrode for the microplasma system. Such an arrangement is particularly well suited for use for embodiments wherein substrate 404 comprises a material such as paper, polymer, and the like.

It is to be understood that the disclosure teaches just some examples of embodiments and that many variations can easily be devised by those skilled in the art after reading this disclosure and that the scope of the present invention is to be determined by the following claims.

What is claimed is:

1. A method comprising:
providing an ink that is a metal-salt-based solution that is substantially particle-free and includes a metal salt comprising a first metal characterized by a bulk resistivity;
inkjet printing a first pattern of the ink on a substrate; and
exposing a first region of the first pattern to a plasma that converts the ink in the first region into a substantially homogeneous first material comprising (1) a framework of the first metal having a resistivity substantially equal to the bulk resistivity and (2) a plurality of voids that is substantially uniformly distributed through the thickness of the first region, wherein the first material has an effective resistivity that is greater than the bulk resistivity.

2. The method of claim 1 wherein the metal-salt-based solution includes the metal-salt dissolved in a solvent comprising a plurality of components, and wherein at least one property of at least two components of the plurality thereof is different, the property being selected from the group consisting of viscosity, surface tension, and evaporation rate.

3. The method of claim 2 wherein the ink is provided such that a first component of the plurality thereof includes a chemical that is selected from the group consisting of an alcohol and an organic solvent and a second component of the plurality thereof includes a glycol.

4. The method of claim 3 wherein the ink is provided such that the first component of the plurality thereof is ethanol and the second component of the plurality thereof is ethylene glycol.

5. The method of claim 1 further comprising:
providing the plasma such that it is a microplasma characterized by a beam-shaped plasma field;
exposing a second region of the first pattern to the plasma;
controlling the plasma while exposing the first region such that the first region is characterized by a first magnitude for a first material parameter that is selected from the group consisting of porosity, surface-area-to-volume ratio, internal stress, and effective resistivity; and controlling the plasma while exposing the second region such that the second region is characterized by a second magnitude for the first material parameter.

6. The method of claim 5 wherein the first region and second region abut within a first feature included in the first pattern.

7. The method of claim 1 wherein the first metal is selected from the group consisting of gold, nickel, tin, lead, bismuth, copper, platinum, and palladium.

8. The method of claim 1 further comprising controlling the porosity of the first metal by controlling the concentration of the first metal salt in the ink.

9. The method of claim 1 further comprising generating the plasma such that it has a shape that is substantially a beam.

\* \* \* \* \*